(12) United States Patent
Hoffmann et al.

(10) Patent No.: US 12,071,544 B2
(45) Date of Patent: Aug. 27, 2024

(54) RADIATION-CURABLE COMPOSITION CONTAINING MERCAPTO-FUNCTIONAL POLYORGANOSILOXANES FOR ADDITIVE-MANUFACTURING TECHNOLOGY

(71) Applicant: Solventum Intellectual Properties Company, Maplewood, MN (US)

(72) Inventors: Henning Hoffmann, Windach (DE); Peter U. Osswald, Tuerkheim (DE)

(73) Assignee: Solventum Intellectual Properties Company, Maplewood, MN (US)

( * ) Notice: Subject to any disclaimer, the term of this patent is extended or adjusted under 35 U.S.C. 154(b) by 467 days.

(21) Appl. No.: 17/310,388

(22) PCT Filed: Feb. 17, 2020

(86) PCT No.: PCT/IB2020/051309
§ 371 (c)(1),
(2) Date: Jul. 30, 2021

(87) PCT Pub. No.: WO2020/170114
PCT Pub. Date: Aug. 27, 2020

(65) Prior Publication Data
US 2022/0112377 A1 Apr. 14, 2022

(30) Foreign Application Priority Data
Feb. 18, 2019 (EP) .................................. 19157710

(51) Int. Cl.
*C08L 83/08* (2006.01)
*B29C 64/129* (2017.01)
*B33Y 70/00* (2020.01)
*B29K 83/00* (2006.01)
*B29K 105/00* (2006.01)
*B29L 31/00* (2006.01)
*B29L 31/26* (2006.01)
*B33Y 10/00* (2015.01)
*B33Y 80/00* (2015.01)

(52) U.S. Cl.
CPC ............ *C08L 83/08* (2013.01); *B29C 64/129* (2017.08); *B33Y 70/00* (2014.12); *B29K 2083/00* (2013.01); *B29K 2105/0032* (2013.01); *B29K 2995/007* (2013.01); *B29K 2995/0077* (2013.01); *B29L 2031/26* (2013.01); *B29L 2031/721* (2013.01); *B29L 2031/753* (2013.01); *B29L 2031/768* (2013.01); *B33Y 10/00* (2014.12); *B33Y 80/00* (2014.12)

(58) Field of Classification Search
USPC ..................................................... 522/99, 148
See application file for complete search history.

(56) References Cited

U.S. PATENT DOCUMENTS

| | | | |
|---|---|---|---|
| 4,035,453 A | 7/1977 | Hittmair | |
| 4,657,959 A | 4/1987 | Bryan | |
| 4,737,593 A | 4/1988 | Ellrich | |
| 4,782,101 A | 11/1988 | Waller | |
| 5,100,929 A | 3/1992 | Jochum | |
| 5,124,212 A * | 6/1992 | Lee | ........................ C03C 25/106 428/447 |

(Continued)

FOREIGN PATENT DOCUMENTS

| CN | 102208567 A | 10/2011 |
|---|---|---|
| CN | 103666064 A * | 3/2014 |

(Continued)

OTHER PUBLICATIONS

Cole, "Thiol-ene functionalized siloxanes for use as elastomeric dental impression materials", Dental Materials 2014, vol. 30, No. 4, pp. 449-455.

(Continued)

*Primary Examiner* — Sanza L. McClendon
(74) *Attorney, Agent, or Firm* — Kevin Weber

(57) ABSTRACT

The invention relates to a radiation-curable silicone composition for additive-manufacturing technology comprising mercapto-functional polyorganosiloxane(s) as Component A, organosiloxane(s) with at least two aliphatic unsaturated carbon-carbon moieties as Component B, photo-initiator(s) as Component C for initiating a curing reaction between Component A and Component B, dye(s) as Component D dissolved in mercapto-functional polyorganosiloxane(s) as Component E, the mercapto-functional polyorganosiloxane(s) having a fraction of (mercaptoalkyl) methylsiloxane units of at least 50 mol %, wherein Component D is dissolved in Component E before Component D is combined with the other components of the radiation-curable silicone composition. The invention also relates to a process of producing a radiation-curable composition wherein the process comprises the steps of providing a solution of dye(s) in a composition comprising mercapto-functional polyorganosiloxane(s) having a fraction of (mercaptoalkyl)methylsiloxane units of at least 50 mol %, combining the solution containing the dye(s) dissolved in the mercapto-functional polyorganosiloxane(s) with mercapto-functional polyorganosiloxane(s), organosiloxane(s) with at least two aliphatic unsaturated carbon-carbon moieties, photo-initiator(s) for initiating a curing reaction between Component A and Component B, optionally filler(s), stabilizer(s) and additive(s).

15 Claims, No Drawings

(56) References Cited

U.S. PATENT DOCUMENTS

| | | | |
|---|---|---|---|
| 5,750,589 A | 5/1998 | Zech | |
| 6,730,156 B1 | 5/2004 | Windisch | |
| 10,155,884 B2* | 12/2018 | Kenney | C08L 83/08 |
| 10,471,653 B2 | 11/2019 | Selbertinger | |
| 11,267,968 B2* | 3/2022 | Osswald | B33Y 70/00 |
| 2005/0027032 A1 | 2/2005 | Hare | |
| 2010/0016519 A1 | 1/2010 | Russ et al. | |
| 2010/0304338 A1 | 12/2010 | Cramer | |
| 2012/0256338 A1 | 10/2012 | Bowman | |
| 2016/0128909 A1 | 5/2016 | Fontein | |
| 2017/0000705 A1 | 1/2017 | Piccardi | |
| 2018/0312707 A1 | 11/2018 | Wang | |
| 2020/0109285 A1* | 4/2020 | Chen | C08L 83/08 |
| 2022/0184885 A1* | 6/2022 | Schaffner | B29C 64/129 |

FOREIGN PATENT DOCUMENTS

| | | |
|---|---|---|
| EP | 0231420 | 8/1987 |
| EP | 0492830 | 7/1992 |
| EP | 2860223 | 4/2015 |
| GB | 2524454 | 9/2015 |
| JP | H03-074463 | 3/1991 |
| JP | 2004020936 A * | 1/2004 |
| JP | 7249845 B2 * | 3/2023 |
| WO | WO 2004-077157 | 9/2004 |
| WO | WO 2015-069454 | 5/2015 |
| WO | WO 2015-143258 | 9/2015 |
| WO | WO 2016-044547 | 3/2016 |
| WO | WO 2016-071241 | 5/2016 |
| WO | WO 2019-150256 | 8/2019 |

OTHER PUBLICATIONS

International Search Report for PCT International Application No. PCT/IB2020/051309, mailed on Jun. 2, 2020, 5 pages.

* cited by examiner

RADIATION-CURABLE COMPOSITION CONTAINING MERCAPTO-FUNCTIONAL POLYORGANOSILOXANES FOR ADDITIVE-MANUFACTURING TECHNOLOGY

CROSS REFERENCE TO RELATED APPLICATIONS

This application is a national stage filing under 35 U.S.C. 371 of PCT/IB2020/051309, filed Feb. 17, 2020, which claims the benefit of European Application No. 19157710.5, filed Feb. 18, 2019, the disclosure of which is incorporated by reference in its/their entirety herein.

FIELD OF THE INVENTION

The invention relates to a radiation-curable silicone composition for additive-manufacturing technology, particularly for processing the composition in a stereolithographic process, i.e. a process comprising a radiation curing step, to obtain an elastic 3-dim article.

The radiation-curable composition comprises mercapto-functional polyorganosiloxane(s), polyorganosiloxane(s) with at least two aliphatic unsaturated carbon-carbon moieties, photo-initiator(s), dye(s) and solvent(s) for the dye(s).

BACKGROUND

Thiolene-based composition for dental use are known. E.g. U.S. Pat. No. 5,100,929 (Jochum et al.) describes a photopolymerizable dental composition which is curable with visible light and which contains polymerizable monomers of the group of the poly-thiol compounds each having at least two thiol groups and polymerizable monomers of the group of the poly-ene compounds each having at least two ethylenically unsaturated groups and at least one photo-initiator, wherein said composition contains respectively related to the sum of all the polymerizable monomers (a) at least 10% by weight of one or more of the poly-thiol compounds, (b) at least 10% by weight of one or more of the poly-ene compounds and (c) as photo-initiator 0.01-5% by weight of at least one acyl phosphine compound. The processing of silicone-based compositions by additive-manufacturing techniques is also known.

WO 2004/077157 A1 (3D Systems) describes liquid, colored radiation-curable compositions which are suitable for production of colored three-dimensional articles by stereolithography. The composition comprises a) one cationically polymerizing organic substance (e.g. an epoxy component), b) one free-radical polymerizing organic substance (e.g. a poly(meth)acrylate), c) one cationic polymerization initiator, d) one free-radical polymerization initiator, e) an effective color-imparting amount of a certain soluble dye compound.

WO 2015/069454 A1 (Dow Corning) describes a composition comprising a) a mercapto-functional polyorganosiloxane, b) an organic molecule comprising at least two aliphatic unsaturated carbon-carbon bonds, c) a filler and d) a photo-initiator, wherein the composition is shear-thinning and UV-curable.

WO 2016/044547 A1 (Dow Corning) describes a method of forming a three-dimensional article by processing a photo-curable organosilicone composition with a 3D-printer. The organosilicone composition comprises a) an organosilicone compound having an average of at least two silicon-bonded ethylenically unsaturated groups and at least one silicon-bonded phenyl group per molecule, b) an organosilicone compound having an average of at least two silicon-bonded hydrogen atoms per molecule, c) a catalytic amount or a photoactivated hydrosilylation catalyst and d) optionally a filler.

WO 2016/071241 A1 (Wacker) describes a generative method for producing molded parts from silicone elastomers, wherein a silicone rubber mass places drop by drop and is crosslinked by means of electromagnetic radiation.

WO 2019/150256 A1 (3M) describes a radiation-curable silicone composition for additive-manufacturing technology comprising mercapto-functional polyorganosiloxane(s), organosiloxane(s) with at least two aliphatic unsaturated carbon-carbon moieties, photo-initiator(s) and at least one of the following components: solvent being able to dissolve the dye(s); and/or surfactant(s) being able to dissolve the dye(s).

However, the solutions proposed in the prior art are not fully satisfying.

SUMMARY OF INVENTION

Silicone-based compositions are typically hydrophobic compositions which are not designed for dissolving other components needed for the preparation of a radiation-curable composition.

The radiation-curing of an inhomogeneous mixture of different components dissolved in a silicone-based composition will typically result in a non-homogeneously cured 3-dim article.

Further, it is not trivial to selectively cure certain parts of a silicone-based compositions by radiation. There is always the risk of over-curing, i.e. the radiation-curable composition is not only cured in those areas which are intended to be cured, but also in adjacent areas.

Thus, there is a need for an improved silicone-based composition which allows the production of elastomeric 3-dim articles by additive-manufacturing techniques e.g. by stereolithography.

Ideally, the silicone-based composition should enable the additive-manufacturing of elastomeric 3-dim articles with sufficient surface resolution.

There is also a need for a silicone-based composition which allows the additive-manufacturing of elastomeric 3-dim articles having sufficient mechanical properties like tensile strength, elongation at break and/or hardness.

There is also a desire for a silicone-based composition which can be processed with an additive-manufacturing process at a sufficiently high processing time.

For processing radiation-curable compositions in an additive-manufacturing unit typically low viscous printing resins are desired as low viscous printing resins can typically be processed in a shorter printing time.

However, certain mechanical/physical properties (such as hardness) of the obtained 3d-printed articles, may not be sufficient. For improving these properties, typically fillers such as fumed silica are added.

The addition of filler, however, typically leads to an increase of the viscosity of the printing resin, which is not desired. The amount of filler, which can be added, is thus limited.

The increase in viscosity and an undesired shear thinning behaviour of the printing resin may even be higher if polar liquids, like ethoxylated surfactants, are added to printing resin. Thus, there is a need for an improved printing resin. One or more objects outlined above are addressed by the invention described in the present text.

In one embodiment, the present invention features a radiation-curable silicone composition for additive-manufacturing technology comprising:
mercapto-functional polyorganosiloxane(s) as Component A,
organosiloxane(s) with at least two aliphatic unsaturated carbon-carbon moieties as Component B,
photo-initiator(s) as Component C for initiating a curing reaction between Component A and Component B,
dye(s) as Component D dissolved in mercapto-functional polyorganosiloxane(s) as Component E, the mercapto-functional polyorganosiloxane(s) having a fraction of (mercaptoalkyl)methylsiloxane units of at least 50 mol % or at least 70 mol %.

Component D is dissolved in Component E before Component D and Component E are combined with the other components of the radiation-curable silicone composition.

The invention also relates to a process of producing the radiation-curable composition described in the present text the process comprising the steps of
dissolving the dye(s) according to Component D as described in the present text in a composition comprising mercapto-functional polyorganosiloxane(s) having a fraction of (mercaptoalkyl)methylsiloxane units of at least 50 mol % according to Component E,
combining the composition containing the dye(s) dissolved in the mercapto-functional polyorganosiloxane(s) with
further mercapto-functional polyorganosiloxane(s) according to Component A as described in the present text,
organosiloxane(s) with at least two aliphatic unsaturated carbon-carbon moieties according to Component B as described in the present text,
photo-initiator(s) for initiating a curing reaction between Component A and Component B as described in the present text, and
optionally other components including filler(s) and stabilizer(s).

In another embodiment, the invention relates to a process of producing a cured 3-dim article, the process comprising the step of processing the radiation-curable composition as described in the claims and the present text by applying an additive-manufacturing technique comprising a radiation curing step.

A further embodiment of the invention is directed to a cured 3-dim article obtained by radiation-curing the radiation-curable composition described in the claims an in the present text.

The invention is also related to a kit of parts comprising the radiation-curable composition as described in the claims in the present text, 3d-printing equipment selected from a 3d-printer (SLA), and optionally an instruction of use.

Unless defined differently, for this description the following terms shall have the given meaning:

The term "compound" or "component" is a chemical substance which has a certain molecular identity or is made of a mixture of such substances, e.g., polymeric substances.

A "hardenable component" or "polymerizable component" is any component which can be cured or solidified in the presence of a photo-initiator by radiation-induced polymerization. A hardenable component may contain only one, two, three or more polymerizable groups. Typical examples of polymerizable groups include unsaturated carbon groups, such as a vinyl group being present i.a. in a (methyl)acrylate group.

A "derivative" or "structural analogue" is a chemical compound showing a chemical structure closely related to the corresponding reference compound and containing all featured structural elements of the corresponding reference compound but having small modifications like bearing additional chemical groups like e.g. alkyl moieties, Br, Cl, or F or not bearing chemical groups like e.g. alkyl moieties in comparison to the corresponding reference compound. That is, a derivative is a structural analogue of the reference compound. A derivative of a chemical compound is a compound comprising the chemical structure of said chemical compound.

A "monomer" is any chemical substance which can be characterized by a chemical formula, bearing polymerizable groups (including (meth)acrylate groups) which can be polymerized to oligomers or polymers thereby increasing the molecular weight. The molecular weight of monomers can usually simply be calculated based on the chemical formula given.

"Polymer" or "polymeric material" are used interchangeably to refer to a homopolymer, copolymer, terpolymer etc.

As used herein, "(meth)acryl" is a shorthand term referring to "acryl" and/or "methacryl". For example, a "(meth)acryloxy" group is a shorthand term referring to either an acryloxy group (i.e., $CH_2=CH-C(O)-O-$) and/or a methacryloxy group (i.e., $CH_2=C(CH_3)-C(O)-O-$).

As used herein, "hardening" or "curing" a composition are used interchangeably and refer to polymerization and/or crosslinking reactions including, for example, photopolymerization reactions and chemical polymerization techniques (e. g., ionic reactions or chemical reactions forming radicals effective to polymerize ethylenically unsaturated compounds) involving one or more materials included in the composition.

A "powder" means a dry, bulk material composed of a large number of fine particles that may flow freely when shaken or tilted.

A "particle" means a substance being a solid having a shape which can be geometrically determined. The shape can be regular or irregular. Particles can typically be analysed with respect to e.g. particle size and particle size distribution. A particle can comprise one or more crystallites. Thus, a particle can comprise one or more crystal phases.

A "photo-initiator" is a substance being able to start or initiate the curing process of a hardenable composition in the presence of radiation, in particular light (wave length of 300 to 700 nm).

A "transparent article" is an article being transparent, if inspected with the human eye, in particular an article which has a light transmission of at least 40% for a path length of 1 mm for light having a wave length of 500 nm. So, a picture can be seen through a platelet (1 mm thick) of such a transparent material.

A "red, orange or yellow dye" is a dye which has a red, orange or yellow colour appearance for the human eye. A "solvent" means a liquid that can dissolve a solid or liquid.

"Surfactants" are agents which are able to lower the surface tension of water. If desired, the effect of lowering the surface tension of water can be measured by determining the water-contact angle.

"Additive manufacturing" or "3d-printing" means processes comprising a radiation curing step used to make 3-dimensional articles. An example of an additive manufacturing technique is stereolithography (SLA) in which successive layers of material are laid down under computer control. The articles can be of almost any shape or geometry and are produced from a 3-dimensional model or other electronic data source.

The term "dental or orthodontic article" means any article which is to be used in the dental or orthodontic field, especially for producing a dental restoration, orthodontic devices, a tooth model and parts thereof.

Examples of dental articles include crowns, bridges, inlays, onlays, veneers, facings, copings, crown and bridged framework, implants, abutments, dental milling blocks, monolithic dental restorations and parts thereof.

Examples of orthodontic articles include brackets, buccal tubes, cleats and buttons and parts thereof.

A dental or orthodontic article should not contain components which are detrimental to the patient's health and thus free of hazardous and toxic components being able to migrate out of the dental or orthodontic article.

A material or composition is "essentially or substantially free of" a certain component within the meaning of the invention, if the material or composition does not contain said component as an essential feature. Thus, said component is not willfully added to the composition or material either as such or in combination with other components or ingredient of other components. Ideally the composition or material does not contain the said component at all. However, sometimes the presence of a small amount of the said component is not avoidable e.g. due to impurities.

"Ambient conditions" mean the conditions which the composition described in the present text is usually subjected to during storage and handling. Ambient conditions may, for example, be a pressure of 900 to 1100 mbar, a temperature of 10 to 40° C. and a relative humidity of 10 to 100%. In the laboratory, ambient conditions are typically adjusted to 20 to 25° C. and 1000 to 1025 mbar.

As used herein, "a", "an", "the", "at least one" and "one or more" are used interchangeably. Also herein, the recitations of numerical ranges by endpoints include all numbers subsumed within that range (e.g., 1 to 5 includes 1, 1.5, 2, 2.75, 3, 3.80, 4, 5, etc.).

Adding an "(s)" to a term means that the term should include the singular and plural form. E.g. the term "additive(s)" means one additive and more additives (e.g. 2, 3, 4, etc.).

Unless otherwise indicated, all numbers expressing quantities of ingredients, measurement of physical properties such as described below and used in the specification and claims are to be understood as number as such and also as being modified by the term "about."

The term "about" can allow for a degree of variability in a value or range, e.g. within 10% or within 5% or within 1% of a given value or a given limit of a range.

The terms "comprise" or "contain" and variations thereof do not have a limiting meaning where these terms appear in the description and claims. The term "comprise" shall include also the terms "consist essentially of" and "consists of". "Consisting essentially of" means that specific further components can be present, namely those which do not materially affect the essential characteristic of the article or composition. "Consisting of" means that no further components should be present.

"And/or" means one or both. E.g., the expression component A and/or component B refers to a component A alone, component B alone, or to both component A and component B.

DETAILED DESCRIPTION

It has been found that the composition described in the text has a couple of advantageous properties.

The addition of a dye to a radiation-curable composition typically allows the influencing of the penetration depth of the radiation used during the curing step. Thus, the addition of a dye typically helps to mitigate the risk of over-curing.

However, the dye is often not sufficiently soluble in the resin matrix of the radiation-curable silicone composition which is typically rather hydrophobic.

It was found, that this issue can be addressed, if the dye is dissolved in a solvent, in particular a solvent, having the same functionality as the mercapto-functionalized polyorganosiloxanes which form part of the curable resin matrix.

It was also found that certain mercapto-functionalized polyorganosiloxanes are better suited for dissolving other components, like dye(s), than polyorganosiloxanes not having these functional groups. The mercapto-functionalized polyorganosiloxanes should have a sufficiently high amount of (mercaptoalkyl)methylsiloxane units.

Thus, dissolving the dye in such a solvent upfront allows a more homogeneous distribution of the dye in the radiation-curable silicone composition.

This facilitates the production of elastomeric 3-dim articles with high surface resolution and sufficient mechanical properties.

Further, the obtained elastomeric 3-dim article has sufficient elastomeric properties like tensile strength and/or elongation at break.

It was also found that using the mercapto-functionalized polyorganosiloxanes described in the present text for dissolving the dye instead of a surfactant also allows the incorporating of a higher amount of filler without negatively affecting the viscosity of the radiation-curable composition.

This makes it possible to produce 3d-printed articles with adequate mechanical properties at a high printing speed.

Thus, the radiation-curable silicone composition is suitable for producing a variety of elastomeric article, even those having small dimensions and structured surfaces.

The invention eliminates the need for a hydrophilic solvent such as Silwet™ L-77 to be added to the printing resin and makes it possible to produce materials with a high filler loading for enhancing mechanical properties and keep the radiation-curable composition at the same time within a reasonable viscosity range.

Further, the possibility to avoid the usage of hydrophilic solvents offers the possibility to increase and/or change fillers or additives without negatively affecting mechanical properties to an undesired extent.

The invention described in the present text also offers the possibility to print more hydrophobic articles.

The radiation-curable composition comprises mercapto-functional polyorganosiloxane(s) as Component A.

The mercapto-functional polyorganosiloxane(s) is typically characterized by the following features alone or in combination:
 a) fraction of (mercaptoalkyl)methylsiloxane units: 7 to 100 mol-%;
 b) molecular weight (Mn): 500 to 20,000 g/mol or 600 to 15,000 g/mol;
 c) viscosity: 10 to 1,000 mPa*s or 20 to 750 mPa*s at 23° C.

Mercapto-functional polyorganosiloxanes having a fraction of (mercaptoalkyl)methylsiloxane units in the range of 70 to 100 are sometimes preferred.

If desired, the molecular weight can be determined by gel permeation chromatography (GPC) using a suitable solvent (e.g. tetrahydrofuran) and an appropriate polystyrene standard.

The mercapto-functional polyorganosiloxane is typically characterized by the following formula (1):

$$[(CH_3)_2RSiO_{1/2}]_w[(CH_3)_3SiO_{1/2}]_x[(CH_3)_2SiO]_y[R(CH_3)SiO]_z, \quad (1)$$

with w being from 0 to 0.1, x being from 0 to 0.1 and w+x being from 0.01 to 0.1; y being from 0 to 0.93, z being from 0.07 to 0.99, wherein each R is independently selected from a mercapto $C_{1-10}$ hydrocarbyl group.

These mercapto-functional polyorganosiloxanes comprise a high amount of mercapto moieties (e.g. in the range of 7 to 100 mol-%).

Examples of mercapto-functional polyorganosiloxanes include poly(mercaptobutyl)methylsiloxane, poly(mercaptopropyl)methylsiloxane, poly(mercaptoethyl)methylsiloxane, poly(mercaptomethyl)methylsiloxane, co-poly(mercaptopropyl)methylsiloxane dimethylsiloxane and mixtures thereof.

In addition to polyorganosiloxanes comprising a high amount of mercapto moieties, the composition can also comprise polyorganosiloxane with a low amount of mercapto moieties.

Using a mixture of two different mercapto-functional polyorganosiloxanes may help to adjust the Shore hardness of the cured composition.

Such polyorganosiloxane with a low amount of mercapto moieties are for example mercaptopropyldimethyl siloxy end-capped polydimethylsiloxanes or copolymers according to formula (2):

$$[(CH_3)_2RSiO_{1/2}]_a[(CH_3)_2SiO]_b \quad (2)$$

with a=0.02-0.03 and R being a mercapto $C_{1-10}$ hydrocarbyl group.

These polyorganosiloxanes typically comprise 2 to 3 mol-% of mercaptopropyldimethylsiloxy units.

Component A is typically present in the following amounts:
  Lower amount: at least 0.5 or at least 1 or at least 2 wt. %;
  Upper amount: at most 50 or at most 45 or at most 40 wt. %;
  Range: 0.5 to 50 or 1 to 45 wt. % or 2 to 40 wt. %;
wt. % with respect to the weight of the whole composition.

The radiation-curable composition also comprises organosiloxane(s) with at least two aliphatic unsaturated carbon-carbon moieties as Component B.

According to one embodiment, the organosiloxane with at least two aliphatic unsaturated carbon-carbon moieties has a linear structure.

According to one embodiment, the organosiloxane with at least two aliphatic unsaturated carbon-carbon moieties having a linear structure is characterized by the following features alone or in combination:
  a) Molecular weight (Mn): 250 to 200,000 g/mol or 500 to 175,000 g/mol;
  b) Viscosity: 1 to 90,000 mPa*s or 2 to 20,000 mPa*s or 10 to 10,000 mPa*s at 23° C.

Typically, the organosiloxane(s) with at least two aliphatic unsaturated carbon-carbon moieties is an organopolysiloxane with at least two pendant or terminal triorganosiloxy groups in which at least one of the three organic groups is a group with an ethylenically unsaturated double bond.

Generally, the groups with an ethylenically unsaturated double bond can be located on any monomeric unit of the organopolysiloxane. It is, however, preferred, that the groups with an ethylenically unsaturated double bond are located on or at least near the terminal, monomeric units of the polymer chain of the organopolysiloxane. In another embodiment, at least two of the groups with an ethylenically unsaturated double bond are located on the terminal monomeric units of the polymer chain.

The term "monomeric units" relates to repeating structural elements in the polymer that form the polymer backbone, unless expressly stated otherwise.

One group of organosiloxane can be represented by formula (3):

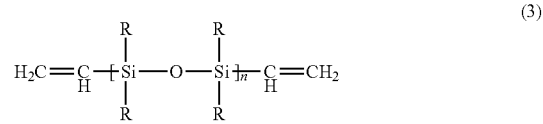

in which the radicals R, independently from each other, represent a non-substituted or substituted, monovalent hydrocarbon group with 1 to about 6 C atoms, which is preferably free from aliphatic multiple bonds and where n generally can be chosen such that the viscosity of the polyorganosiloxane lies in the range of 1 to 90,000 mPa*s or 2 to 20,000 or 10 to 10,000 mPa*s. The parameter n can, e.g., be in the range of 3 to 10,000 or 5 to 5,000.

Generally, the radical R in the above formula can independently represent any non-substituted or substituted, monovalent hydrocarbon group with 1 to 6 C atoms. Non-substituted or substituted, monovalent hydrocarbon groups with 1 to 6 C atoms can be linear or, if the number of carbon atoms exceeds 2, branched or cyclic. Generally, the radical R can be equipped with any type of substituent or substituents provided they do not interfere with any other constituents or substituents of the composition and do not interfere with the curing reaction.

The term "interfere" as used in the context of the present text relates to any influence of such a substituent on at least one of the other substituents or constituents of the composition or the curing reaction, or both, which might be detrimental to the properties of the hardened product.

The term "detrimental" as used in the context of the present text relates to a change of properties of the precursors or the cured product that negatively affect the usefulness of the precursors or the cured product in their intended use.

In another embodiment, at least 50% of the radical(s) R are methyl groups. Examples of other radicals R that can be present in the polyorganosiloxane according to the above formula are ethyl, propyl, iso-propyl, n-butyl, iso-butyl, tert-butyl, the pentyl isomers, the hexyl isomers, vinyl, allyl, propenyl, iso-propenyl, 2- and 3-n-butenyl, the pentenyl isomers, the hexenyl isomers, fluorine substituted aliphatic radicals like 3,3,3-trifluoropropyl groups, cyclopentyl or cyclohexyl groups, cyclopentenyl or cyclohexenyl groups or aromatic or heteroaromatic groups like phenyl or substituted phenyl groups.

Examples for such molecules are described in U.S. Pat. No. 4,035,453 (Hittmaier et al.), the disclosure of which, especially regarding the above-mentioned molecules, their chemical constitution and their preparation, is regarded as being part of the disclosure of the present document and is included herein by reference.

Particularly preferred are linear polydimethylsiloxanes according to the above formula having viscosities within the specified viscosity ranges and end groups comprising dimethylvinylsiloxy units and methyl groups as the radical(s) R.

A Component B which can be employed can consist of one type B1 of organosiloxane.

The organosiloxane can have a viscosity starting in the range of 1 to 90,000 mPa*s, or 5 to 20,000 mPa*s or 10 to 10,000 mPa*s.

It is, however, also possible that Component B comprises two or more constituents, B1, B2 and so on, which can differ, e.g., in the chemical composition of their backbone, or their molecular weight, or their substituents or their viscosity, or any other differentiating feature or two or more of the above-mentioned features.

In one embodiment, the difference in viscosities of different constituents of Component B can be higher than a factor of 2, e.g., higher than a factor of 5, higher than a factor of 10, higher than a factor of 20, higher than a factor of 30, higher than a factor of 40, higher than a factor of 50, higher than a factor of 60, higher than a factor of 70, higher than a factor of 80, higher than a factor of 90 or higher than a factor of 100. The difference in viscosities can be even higher, e.g., higher than a factor of 200, higher than a factor of 300, higher than a factor of 500, higher than a factor of 800, higher than a factor of 1,000 or higher than a factor of 5,000, it should, however, preferably not exceed a value higher than a factor of 10,000. It should be kept in mind that the values mentioned above relate to a factor for the difference in viscosities, not the viscosity values themselves.

The organosiloxane(s) with at least two aliphatic unsaturated carbon-carbon moieties having a linear structure is present in the following amounts:
Lower amount: at least 10 or at least 20 or at least 30 wt. %;
Upper amount: at most 98 or at most 95 or at most 92 wt. %;
Range: 10 to 98 or 20 to 95 wt. % or 30 to 92 wt. %; wt. % with respect to the weight of the whole composition.

Component B can also include QM resin containing vinyl groups (i.e. VQM resin).
Using QM resins can be beneficial as these components may help to improve mechanical properties like tensile strength.

QM resins comprise as Q a quadrifunctional $SiO_{4/2}$ unit and as M building blocks such as monofunctional units $R_3SiO_{1/2}$, wherein R is independently selected from vinyl, methyl, ethyl or phenyl or tri- or bi-functional units.

An example of a VQM resin which can be used has the structure according to formula (4):

$$Si[O-Si(CH_3)_2-CH=CH_2]_4 \qquad (4)$$

Examples of suitable QM resins are e.g. described in US 2005/0027032 (Hare). The content of this document with respect to the description of QM resins is herewith incorporated by reference.

VQM resins can be used in addition to or instead of the organosiloxane having a linear structure as described above.

Thus, the composition described in the present text may contain two kinds of organosiloxane components, one according to formula (3) and QM resins according to formula (4) or other VQM resins.

In one embodiment, it is preferred to use dispersion of QM resin(s) in linear vinyl-terminated polydimethylsiloxane fluids.

According to one embodiment, the dispersion of the organosiloxane with at least two aliphatic unsaturated carbon-carbon moieties having a QM structure is characterized by the following features alone or in combination:
a) viscosity: 500 to 90,000 mPa*s or 550 to 85,000 mPa*s or 600 to 80,000 mPa*s at 23° C.;
b) concentration of unsaturated moieties: at least 0.15 mmol/g or in the range of 0.15 to 0.80 mmol/g.

A high concentration of unsaturated moieties may help to further improve mechanical properties like tensile strength.

If present, VQM resins or dispersions of VQM resins in organosiloxanes are present in the following amounts:
Lower amount: at least 10 or at least 20 or at least 30 wt. %;
Upper amount: at most 98 or at most 95 or at most 92 wt. %;
Range: 10 to 98 or 20 to 95 wt. % or 30 to 92 wt. %; wt. % with respect to the weight of the whole composition.

Sometimes it is preferred to use a mixture of organosiloxane(s), in particular a mixture of organosiloxane(s) with at least two aliphatic unsaturated carbon-carbon moieties having a linear structure, e.g. according to formula (3), and dispersion(s) of organosiloxanes having a VQM structure.

If a mixture is used, the ratio of organosiloxanes according to formula (3)/dispersion of organosiloxanes having a VQM structure is typically in a range of 1 to 4 to 4 to 1, or 1 to 2 to 2 to 1 with respect to weight.

The radiation-curable composition described in the present text comprises one or more photo-initiator(s) as Component C.

The nature and structure of the photo-initiator is not particularly limited, unless the desired result cannot be achieved.

Using a photo-initiator being soluble in the radiation-curable resin composition of the present text is preferred.

The photo-initiator(s) has typically a light absorption band in a wave length range of 250 to 450 nm, preferably in the range of 300 to 450 nm or of 350 to 420 nm.

The photo-initiator is capable of generating free radicals for polymerization upon exposure to light energy having a wavelength in the range of 250 and 450 nm.

The following class of photo-initiator(s) was found to be useful: one-component system where two radicals are generated by cleavage.

Photo-initiators which can be used typically contain a moiety selected form benzoin ether, acetophenone, benzoyl oxime or acyl phosphine oxids, phenylglyoxate, ☐-hydroxyketones or ☐-aminoketones.

In one embodiment, blends of at least two different photo-initiators are used.
Exemplary UV initiators include 1-hydroxycyclohexyl benzophenone (available, for example, under the trade designation "OMNIRAD™ 184" from IGM Resin B.V., Waalwijk, Netherlands), 4-(2-hydroxyethoxy)phenyl-(2-hydroxy-2-propyl) ketone (available, for example, under the trade designation "OMNIRAD™ 2959" from IGM Resin B.V), 2-hydroxy-2-methylpropiophenone (available, for example, under the trade designation "OMNIRAD™ 1173" from IGM Resin B.V.) and 2-benzyl-2-(N,N-dimethylamino)-1-(4-morpholinophenyl)-1-butanone (OMIRAD™ 369, IGM Resins B.V.).

A particularly suitable class of photo-initiators include the class of acylphosphine oxides, as described e.g. in U.S. Pat. No. 4,737,593 (Elrich et al.).

Such acylphosphine oxides are of the general formula

$$(R^9)_2-P(=O)-C(=O)-R^{10} \qquad (5)$$

wherein each $R^9$ individually can be a hydrocarbyl group such as alkyl, cycloalkyl, aryl, and aralkyl, any of which can be substituted with a halo-, alkyl- or alkoxy-group, or the two $R^9$ groups can be joined to form a ring along with the phosphorous atom, and wherein $R^{10}$ is a hydrocarbyl group, an S-, O-, or N-containing five- or six-membered heterocyclic group, or a $-Z-C(=O)-P(=O)-(R^9)_2$ group, wherein Z represents a divalent hydrocarbyl group such as alkylene or phenylene having 2 to 6 carbon atoms.

Preferred acylphosphine oxides are those in which the $R^9$ and $R^{10}$ groups are phenyl or lower alkyl- or lower alkoxy-substituted phenyl. By "lower alkyl" and "lower alkoxy" is meant such groups having from 1 to 4 carbon atoms.

A preferred acylphosphine oxide is bis(2,4,6-trimethylbenzoyl)phenyl phosphine oxide (OMNIRAD™ 819, IGM Resin B.V., Waalwijk, Netherlands).

In another embodiment, it is preferred to use liquid blends of acylphosphine oxides with at least one other photo-initiator (available e.g. as OMNIRAD™ 1000, OMNIRAD™ 2022, OMNIRAD™ 2100 or OMNIRAD™ 4265, IGM Resin B.V., Waalwijk, Netherlands).

Tertiary amine reducing agents may be used in combination with an acylphosphine oxide.

Illustrative tertiary amines include ethyl 4-(N,N-dimethylamino)benzoate and N,N-dimethylaminoethyl methacrylate.

Also useful are photo-initiators comprising an alpha,beta-triketon moiety or comprising an alpha-diketon dialkyl ketal moiety.

The photo-initiator(s) is typically present in the following amounts:
Lower amount: at least 0.01 or at least 0.05 or at least 0.1 wt. %;
Upper amount: at most 5 or at most 3 or at most 2 wt. %;
Range: 0.01 to 5 or 0.01 to 3 wt. % or 0.01 to 2 wt. %;
wt. % with respect to the weight of the whole composition.

The radiation-curable composition described in the present text comprises dye(s) as Component D.

The dye(s) is dissolved in a solvent selected from mercapto-functional polyorganosiloxane(s) before the dye(s) is combined with the other components of the radiation-curable composition.

The upfront dissolving of the dye(s) in the mercapto-functional polyorganosiloxane(s) typically leads to a different and more homogenous distribution of the dye(s) in the final composition compared to a composition where the respective components have simply been combined. As described in the text further down below, the respective cured composition shows improved mechanical properties.

The nature and structure of Component D is not particularly limited unless the desired result cannot be achieved.

According to one embodiment, the dye is a red dye, orange dye or yellow dye.

If desired, a combination of different dyes can be used.

A red dye has a light absorption band, preferably shows a light absorption maximum, within a wave length range of 540 to 600 nm.

An orange dye has a light absorption band, preferably shows a light absorption maximum, within a wave length range of 490 to 540 nm.

A yellow dye has a light absorption band, preferably shows a light absorption maximum, within a wave length range of 460 to 490 nm.

The dye may also be a red, orange or yellow fluorescent dye, i.e. a dye showing fluorescence, if irradiated with light.

According to one embodiment, the dye is characterized by the following features alone or in combination:
a) solubility: at least 0.5 wt. % or at least 0.75 wt. % or at least 1.0 wt. % in PEG 400 at 50° C.;
b) having a light absorption band in the range of 460 to 600 nm;
c) having a fluorescence band in the range of 470 to 650 nm;
d) comprising a perylene moiety;
e) solubility: less than 1 g in 100 g water at 23° C.

A combination of the features a) and b) or a), b) and c) or a), b), c) and d) can sometimes be preferred. The dye is essentially not soluble in water. If desired, the solubility can be determined as described in the example section.

Adding a red, orange or yellow dye as described in the present text may help to improve the printing accuracy, particularly as regard the surface details.

Further, it can be advantageous if the red, orange or yellow dye absorb light in the range from 380 to 420 nm. Such a light absorption may further contribute to a good printing accuracy.

Particularly, the presence of a dye showing fluorescence in the spectrum visible to the human eye allows an easy inspection and control of the 3-dim article during an additive manufacturing process, in particular an SLA process.

Suitable examples for the red dye include Lumogen™ F Red 300 (BASF) and Fluoreszenzrot 94720 (Kremer) having an absorption maximum at 575 nm.

The chemical name of Lumogen™ F Red 300 (BASF) is N,N'-Bis (2,6-Di(isopropyl)phenyl)-1,6,7,12-tetraphenoxyperylene-3,4:9,10-bisimide.

A suitable example for an orange dye is Fluoreszenzorange 94738 (Kremer) having an absorption maximum at 526 nm.

A suitable example for a yellow dye is Fluoreszenzgelb 94700 (Kremer) having an absorption maximum at 474 nm.

The dye(s) is typically present in the following amount(s):
Lower limit: at least 0.001 or at least 0.003 or at least 0.005 wt. %;
Upper limit: utmost 1 or utmost 0.5 or utmost 0.1 wt. %;
Range: 0.001 to 1 or 0.003 to 0.5 or 0.005 to 0.1 wt. %;
wt. % with respect to the whole composition.

The radiation-curable composition described in the present text also comprises solvent(s) as Component E for dissolving the dye(s). The solvent(s) is selected from mercapto-functional polyorganosiloxane(s).

It has been found that mercapto-functional polyorganosiloxane(s) having a sufficiently high mercapto functionality are particularly suitable for dissolving the dye(s). If the mercapto-content is too low, the dye may not be sufficiently soluble.

The mercapto-functional polyorganosiloxane(s) has a fraction of (mercaptoalkyl)-methylsiloxane units of at least 50 mol % or at least 70 mol %.

The mercapto-functional polyorganosiloxane(s) typically has a viscosity in the range of 20 to 200 cSt (23° C.) or 50 to 180 cSt (23° C.). If the viscosity is too high, the dissolving of the dye(s) might become more difficult.

The mercapto-functional polyorganosiloxane(s) for dissolving the dye(s) can be same as or different than the mercapto-functional polyorganosiloxane(s) described as Component A.

According to one embodiment the mercapto-functional polyorganosiloxane(s) having a fraction of (mercaptoalkyl)methylsiloxane units of at least 50 mol % according to Component E correspond to or are part of the mercapto-functional polyorganosiloxane(s) according to component A.

The mercapto-functional polyorganosiloxane(s) having a fraction of (mercaptoalkyl)methylsiloxane units of at least 50 mol % is able to dissolve at least 0.1 wt. % or at least 0.2 wt. % or at least 0.3 wt. % of the dye(s) used at 50° C. If desired, the solubility can be determined as described in the example section.

The radiation-curable composition may also contain solvent(s) as Component F being different from Component E.

Solvent(s) as Component F which can be used include polyethylene glycol (e.g. PEG 400), polypropylene glycol, co-polymers of polyethylene glycol and polypropylene glycol, dimethylformamide, butyl acetate, toluene, xylol, benzyl alcohol.

If present, the solvent(s) as Component F is present in the following amounts:
Lower limit: at least 0.1 or at least 0.3 or at least 0.5 wt. %;
Upper limit: utmost 15 or utmost 12 or utmost 10 wt. %;
Range: 0.1 to 15 or 0.3 to 12 or 0.5 to 10 wt. %;
wt. % with respect to the whole composition.

The radiation-curable composition described in the present text may also comprise filler(s) as Component G.

The nature and structure of the filler(s) are not particularly limited as far as the desired results can be achieved.

If present, the filler(s) is typically present in either of the following amounts:
Lower limit: at least 1 or at least 5 or at least 10 wt. %;
Upper limit: utmost 60 or utmost 50 or utmost 40 wt. %;
Range: 1 to 60 or 5 to 50 or 10 to 40 wt. %;
wt. % with respect to the weight of the dental composition.

Reinforcing and non-reinforcing filler(s) can be used.

The filler(s) can be selected from aggregated, agglomerated or discrete (i.e. non-agglomerated, non-aggregated) nano-sized particles or mixtures thereof.

It was found that compared to other fillers, using nano-filler(s) can be beneficial, because it allows for the formulation of a composition with high filler load resulting typically in better mechanical properties.

According to one embodiment, the radiation-curable composition comprises aggregated nano-sized particles.

The filler comprising aggregated nano-sized particles can typically be characterized by at least one or all of the following features:
Specific surface (BET according to Brunauer, Emmet and Teller): 30 to 400 or 60 to 300 or 80 to 250 $m^2/g$;
comprising particles of $SiO_2$, $ZrO_2$, $Al_2O_3$ and mixtures thereof.

If desired, the specific surface can be determined according to Brunauer, Emmet and Teller (BET; e.g. by using a device like Monosorb™ available from Quantachrome).

A suitable filler comprising aggregated nano-sized particles can be produced according to the processes described e.g. in U.S. Pat. No. 6,730,156 (Windisch et al.) (preparatory example A).

A useful filler comprising aggregated nano-sized particles can be prepared from a suitable sol and one or more oxygen containing heavy metal compound solution(s) precursors which may be salts, sols, solutions, or nano-sized particles; of these, sols are preferred. For purposes of this text, a sol is defined as a stable dispersion of colloidal solid particles within a liquid. The solid particles are typically denser than the surrounding liquid and small enough so that the dispersion forces are greater than the gravitational force. In addition, the particles are of a size small enough so that they generally do not refract visible light. Judicious choice of the precursor sols leads to desired degree of visual opacity, strength etc. Factors that will guide the choice of the sol depends on the combination of the following properties: a) the average size of the individual particles, which is preferably less than 100 nm in diameter, b) the acidity: the pH of the sol should be preferably below 6 and more preferably below 4, and c) the sol should be free of impurities that cause undue aggregation (during the filler preparation process) of the individual discrete particles, during the subsequent steps such as spray drying or calcining, into larger size particles that cannot be easily dispersed or commuted and hence decrease the translucency and polishability of a dental restoration made out of a composite comprising such nanoparticles.

If the starting sol is basic, it should be acidified e.g. by addition of nitric or other suitable acid to decrease the pH value. However, choosing a basic starting sol is less desirable since it requires an additional step and may lead to the introduction of undesired impurities. Typical impurities that are preferably avoided are metal salts, particularly salts of alkaline metals e.g. sodium.

The non-heavy metal sol and heavy metal oxide precursors are mixed together preferably at a molar ratio to match the index of refraction of the hardenable resin. This imparts a low and desirable visual opacity. Preferably, the molar ratio ranges of non-heavy metal oxide ("non-HMO") to heavy metal oxide ("HMO"), expressed as non-HMO:HMO is 0.5:1 to 10:1, more preferably 3:1 to 9:1, and most preferable 4:1 to 7:1.

In a preferred embodiment where the aggregated nano-sized particles contain silica and zirconium containing compounds, the method of preparation starts with a mixture of silica sol and zirconyl acetate, at about a 5.5:1 molar ratio. Prior to mixing the non-heavy metal oxide sol with the heavy metal oxide precursor, the pH of the non-heavy metal oxide sol is preferably reduced to provide an acidic solution having a pH of 1.5 to 4.0.

The non-heavy metal oxide sol is then slowly mixed with the solution containing the heavy metal oxide precursor and vigorously agitated. Strong agitation is preferably performed throughout the blending process. The solution is then dried to remove the water and other volatile components. Drying can be accomplished in various ways, including for example, tray drying, fluidized bed and spray drying. In the preferred method where zirconyl acetate is used, drying by means of spray drying.

The resulting dried material is preferably made up of small substantially spherical particles as well as broken hollow spheres. These fragments are then batch calcined to further remove residual organics. The removal of the residual organics allows the filler to become more brittle, which results in more efficient particle size reduction. During calcining, the soak temperature is preferably set at 200° C. to 800° C., more preferably 300° C. to 600° C. Soaking is performed for 0.5 hours to 8 hours, depending on the amount of material being calcined. It is preferred that the soak time of the calcine step be such that a plateaued surface area is obtained. It is preferred that the time and temperature be chosen such that the resulting filler is white in color, free from black, grey, or amber colored particles, as determined by visual inspection.

The calcined material is then preferably milled to a median particle size of less than 5 µm, preferably less than 2 µm (on a volumetric basis), as can be determined by using a Sedigraph 5100 (Micrometrics, Norcross, Ga.). The particle size determination can be performed by first obtaining the specific density of the filler using an Accuracy 1330 Pycometer (Micrometrics, Norcross, Ga.). Milling can be accomplished by various methods including for example, stirred milling, vibratory milling, fluid energy milling, jet milling and ball milling. Ball milling is the preferred method.

The resulting fillers comprise, contain, consist essentially or consist of aggregated nano-sized particles. If desired, this can be proven by transmission electron microscopy (TEM).

If desired, the surface of the filler particles can be surface treated. The surface-treatment can be accomplished according to a process as described in U.S. Pat. No. 6,730,156 (Windisch et al.) (e.g. preparatory example B).

Once dispersed in the resin, the filler remains in an aggregated stage. That is, during the dispersion step the particles do not break up into discrete (i.e. individual) and un-associated (i.e. non-aggregated) particles.

If present, the filler comprising aggregated nano-sized particles is typically present in either of the following amounts:
Lower limit: at least 1 or at least 5 or at least 10 wt. %;
Upper limit: utmost 55 or utmost 50 or utmost 45 wt. %;
Range: 1 to 55 or 5 to 50 or 10 to 45 wt. %;
wt. % with respect to the weight of the dental composition.

According to one embodiment, the filler(s) comprises agglomerated nano-sized particles.

Nano-filler(s) comprising agglomerated nano-sized particles are typically characterized by at the following features alone or in combination:
Specific surface: (BET according to Brunauer, Emmet and Teller): 30 to 400 or 50 to 300 or 70 to 250 m$^2$/g;
comprising particles of $SiO_2$, $ZrO_2$, $Al_2O_3$ and mixtures thereof.

Suitable agglomerated nanoparticles include fumed silicas such as products sold under the tradename Aerosil™ e.g. Aerosil™ OX-130, -150, and -200, Aerosil™ R8200 available from Evonik, (Essen, Germany), CAB-O-SIL™ M5 available from Cabot Corp (Tuscola, Ill.), and HDK™, e.g. HDK-H 2000, HDK H15; HDK H18, HDK H20 and HDK H30 available from Wacker.

If present, agglomerated nano-sized particles are typically present in either of the following amounts:
Lower limit: at least 0.5 or at least 1 or at least 2 wt. %;
Upper limit: utmost 20 or utmost 15 or utmost 10 wt. %;
Range: 0.5 to 20 or 1 to 15 or 2 to 10 wt. %
with respect to the weight of whole composition.

According to one embodiment, the filler(s) comprises discrete nano-sized particles.

Discrete nano-sized particles which can be used are preferably substantially spherical and substantially non-porous.

Filler(s) comprising discrete nano-sized particles are typically characterized by at least one or all of the following features:
Average particle diameter: less than 200 nm or less than 100 nm;
comprising particles of $SiO_2$, $ZrO_2$ and mixtures thereof.

Preferred nano-sized silicas are commercially available from Nalco Chemical Co. (Naperville, Ill.) under the product designation NALCO™ COLLOIDAL SILICAS. For example, preferred silica particles can be obtained from using NALCO™ products 1040, 1042, 1050, 1060, 2327 and 2329.

If present, the discrete nano-sized particles are typically present in either of the following amounts:
Lower limit: at least 0.5 or at least 3 or at least 5 wt. %;
Upper limit: utmost 20 or utmost 15 or utmost 10 wt. %;
Range: 0.5 to 20 or 3 to 15 or 5 to 10 wt. %;
wt. % with respect to the weight of the whole composition.

According to one embodiment, the radiation-curable composition comprises:
aggregated nano-sized particles in an amount of 1 to 55 wt. %,
agglomerated nano-sized particles in an amount of 0.5 to 20 wt. %,
discrete nano-sized particles in an amount of 0.5 to 20 wt. %.
wt. % with respect to the weight of the whole composition.

The above-mentioned fillers can be hydrophobized, for example by treatment with organosilanes or siloxanes or by the etherification of hydroxyl groups to alkoxy groups.

The radiation-curable composition described in the present text does typically not require the use of a surfactant for dissolving the dye(s).

Adding surfactant(s) may have a negative impact on the capacity of the radiation-curable composition described in the present text for incorporating filler(s).

However, if the incorporation of a higher amount of filler is not desired, according to one embodiment the radiation-curable composition described in the present text may also comprise surfactant(s) as Component H.

Using a surfactant having an HLB value in the range of 3-8 is sometimes preferred.
For non-ionic surfactants, the HLB value can be calculated according to the following formula (Griffin's method): $HLB=20*M_h/M$, with $M_h$ being the molecular mass of the hydrophilic portion of the molecule and M being the molecular mass of the whole molecule.

An HLB value of 0 corresponds to a completely hydrophobic molecule, and a value of 20 corresponds to a completely hydrophilic molecule.

Using a surfactant is sometimes preferred as such a substance can help to dissolve the dye(s) in the radiation-curable composition.

The nature and structure of the surfactant is not particularly limited unless the desired result cannot be achieved.

Surfactants which can be employed can generally be chosen freely from all types of surfactants which improve the hydrophilicity of a silicone moiety containing material (especially, if curable via a hydrosilylation reaction).

Useful surfactants can generally be chosen from anionic, cationic or non-ionic surfactants or mixtures of two or more of such types of surfactants. Using non-ionic surfactants is often preferred.

It can be further preferred, if a mixture of two or more non-ionic surfactants is used.

In certain embodiments, the surfactant or at least one of the surfactants contains a Si-containing moiety, that is, it can be referred to as a Si-containing surfactant.

Suitable examples thereof include hydrophilic silicone oils, which are not capable of being covalently incorporated into the hardened polymer network.

Suitable silicone moieties containing surfactants can be summarized under the following formula

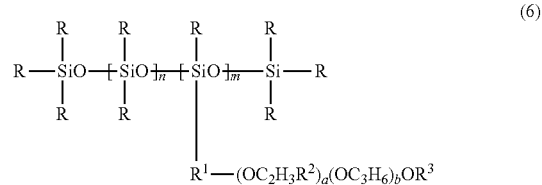
(6)

where each R is independently a monovalent hydrocarbyl radical with 1 to 22 C-atoms, $R^1$ is a divalent hydrocarbylene radical 1 to 26 C-atoms, each $R^2$ is independently hydrogen or a lower hydroxyalkyl radical, $R^3$ is hydrogen or a monovalent hydrocarbyl radical with 1 to 22 C-atoms, n and b are independently greater than or equal to zero, and m and a are independently greater than or equal to one, with the proviso that a has a sufficient value and b is small enough so that a cured composition of the invention has the desired water contact angle.

Preferably R and R³ are —CH₃, R¹ is —C₃H₆—, R² is hydrogen, n is zero or 1, m is 1 to 5, a is 5 to 20 and b is 0.

Several of such ethoxylated surfactants are for example available from Momentive Performance Materials Inc. including "SILWET" surface active copolymers. Preferred surface-active copolymers include Silwet™ 35, Silwet™ L-77, Silwet™ L-7600 and Silwet™ L-7602, Silwet™ L-7608 and Silwet™ Hydrostable 68 and Silwet™ Hydrostable 611. Silwet™ L-77 is an especially preferred ethoxylated surfactant which is believed to correspond to the above formula where R and R³ are —CH₃, R¹ is —C₃H₆—, R² is hydrogen, n is zero or 1, m is 1 or 2, a is 7, and b is 0. Also possible is the use of MASIL™ SF19, as obtainable from Lubrizol performance products, Spartanburg, US.

Useful surfactants also include polyether carbosilanes of the general formula

Q-P—(OC$_n$H$_{2n}$)$_x$-OT (7)

in which Q stands for R₃—Si— or R₃—Si—(R'—SiR₂)$_a$—R'—SiR"₂—
where every R in the molecule can be the same or different and stands for an aliphatic C₁-C₁₈, a cycloaliphatic C₆-C₁₂ or an aromatic C₆-C₁₂ hydrocarbon radical, which can optionally be substituted by halogen atoms, R' is a C₁-C₁₄ alkylene group, R" is R in the case of a≠0 or is R or R₃SiR' in the case of a=0, and a=0-2; P stands for a C₂-C₁₈ alkylene group, preferably a C₂-C₁₄ alkylene group or A-R''', where A represents a C₂-C₁₈ alkylene group and R''' a functional group from the following list: —NHC(O)—, —NHC(O)—(CH₂)$_{n-1}$—, —NHC(O)C(O)—, —NHC(O)(CH₂)$_v$C(O)—, —OC(O)—, —OC(O)—(CH₂)$_{n-1}$—, —OC(O)C(O)—, —OC(O)(CH₂)$_v$C(O)—, —OCH₂CH(OH)CH₂OC(O)(CH₂)$_{n-1}$—, OCH₂CH(OH)CH₂OC(O)(CH2)$_v$C(O)— with v=1-12; T is H or stands for a C₁-C₄ alkyl radical or a C₁-C₄ acyl radical; x stands for a number from 1 to 200 and n stands for an average number from 1 to 6, preferably 1 to 4. Thus, the element —SiR"₂— can also comprise the sub-structure —Si(R)(R₃SiR')—.

The polyether part can be a homopolymer, but can also be a statistical, alternating or block copolymer.

Suitable polyether carbosilanes are selected from the group consisting of:
Et₃Si—(CH₂)₃—O—(C₂H₄O)y-CH₃, Et=Ethyl; Et₃Si—CH₂—CH₂—O—(C₂H₄O)y-CH₃, Et=Ethyl; (Me₃Si—CH₂)₃ Si—(CH₂)₃—O—(C₂H₄O)y-CH₃, Me=Methyl; Me₃Si—CH₂—SiMe₂-(CH₂)₃—O—(C₂H₄O)y-CH₃, Me=Methyl; (Me₃Si—CH₂)₂SiMe-(CH₂)₃—O—(C₂H₄O)y-CH₃, Me=Methyl; Me₃Si—(CH₂)₃—O—(C₂H₄O)y-CH₃, Me=Methyl; Me₃Si—CH₂CH₂—O—(C₂H₄O)y-CH₃, Me=Methyl; Ph₃Si—(CH₂)₃—O—(C₂H₄O)y-CH₃, Ph=phenyl; Ph₃Si—CH₂—CH₂—O—(C₂H₄O)y-CH₃, Ph=phenyl; Cy₃Si—(CH₂)₃—O—(C₂H₄O)y-CH₃, Cy=cyclohexyl; Cy₃Si—CH₂CH₂—O—(C₂H₄O)y-CH₃, Cy=cyclohexyl; (C₆H₁₃)₃Si—(CH₂)₃—O—(C₂H₄O)y-CH₃, (C₆H₁₃)₃Si—CH₂CH₂—O—(C₄H₄O)y-CH₃ in which y conforms to the relation: 5≤y≤20 and mixtures thereof.

Also preferred is sometimes the use of non-ionic surface-active substances according to the formula:

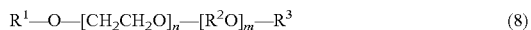

R¹—O—[CH₂CH₂O]$_n$—[R²O]$_m$—R³ (8)

wherein R¹ represents an aromatic or aliphatic, linear or branched hydrocarbon group having at least 8 carbon atoms, R² represents an alkylene having 3 carbon atoms, R³ represents hydrogen or a C1-C3 alkyl group, n has a value of 0 to 40, m has a value of 0 to 40 and the sum of n+m being at least 2.

It will be understood that in the above formula, the units indexed by n and m may appear as blocks or they may be present in an alternating or random configuration.

Examples of non-ionic surfactants according to the formula above include alkylphenol oxethylates such as ethoxylated p-isooctylphenol commercially available under the brand name TRITON™ such as for example TRITON™ X 100 wherein the number of ethoxy units is about 10 or TRITON™ X 114 wherein the number of ethoxy units is about 7 to 8. Still further examples include those in which R¹ in the above formula represents an alkyl group of 4 to 20 carbon atoms, m is 0 and R³ is hydrogen. An example thereof includes isotridecanol ethoxylated with about 8 ethoxy groups and which is commercially available as GENAPOL™ X080 from Clariant GmbH. Non-ionic surfactants according to the above formula in which the hydrophilic part comprises a block-copolymer of ethoxy groups and propoxy groups may be used as well. Such non-ionic surfactants are commercially available from Clariant GmbH under the trade designation GENAPOL™ PF 40 and GENAPOL™ PF 80. Further suitable non-ionic surfactants that are commercially available include Tergitol™ TMN 6, Tergitol™ TMN 10, or Tergitol™ TMN 100X. Also statistical, alternating or block copolymers of ethylene oxide and propylene oxide are suitable surfactants according to the present invention. Such non-ionic surfactants are available e.g. under the trade name Breox™ A, Synperonic™ or Pluromc™.

A mixture of a silicone moieties containing surfactant and one or more non-ionic surfactants selected from alkoxylated hydrocarbon surfactants can be used, as well.

Surfactants which can also be used, either alone or as a mixture of two or more thereof, can be found in U.S. Pat. No. 5,750,589 (Zech et al), col. 2, l. 47 to col. 3 l. 27 and col. 3, l. 49 to col. 4, l. 4 and col. 5, l. 7 to col. 14, l. 20. Other surfactants which can be used, either alone or as a mixture of two or more thereof, can be found in U.S. Pat. No. 4,657,959 (Bryan et al.), col. 4, l. 46 to col. 6. l. 52 as well as in EP 0 231 420 B1 (Gribi et al.) p 4, l. 1 to p 5, l. 16 and in the examples. Suitable examples are further described e.g. in U.S. Pat. No. 4,782,101 (Waller et al.).

The content of these documents with regards to hydrophilizing agents and their preparation is herewith incorporated by reference.

If present, the surfactant(s) as Component H is present in the following amounts:
Lower limit: at least 0.1 or at least 0.3 or at least 0.5 wt. %;
Upper limit: utmost 15 or utmost 12 or utmost 10 wt. %;
Range: 0.1 to 15 or 0.3 to 12 or 0.5 to 10 wt. %;
wt. % with respect to the whole composition.

The radiation-curable composition described in the present text may also comprise stabilizer(s) as Component I.

A stabilizer may extend the shelf life of the curable composition, help prevent undesired side reactions, and adjust the polymerization process of the radiation-curable component(s) present in the curable composition.

Adding one or more stabilizer(s) to the curable composition may further help to improving the accuracy or detail resolution of the surface of the 3-dim article to be produced.

Stabilizer(s) which can be used often comprise a phenol moiety or phosphonic acid moieties.

Specific examples of stabilizer(s) which can be used include: p-methoxyphenol (MOP), hydroquinone monomethylether (MEHQ), 2,6-di-tert-butyl-4-methyl-phenol (BHT; Ionol), phenothiazine, 2,2,6,6-tetramethyl-piperidine-1-oxyl radical (TEMPO) Vitamin E; N,N'-di-2-butyl- 1,4-phenylenediamine; N,N'-di-2-butyl-1,4-phenylenediamine; 2,6-di-tert-butyl-4-methylphenol; 2,4-dimethyl-6-tert-butylphenol; 2,4-dimethyl-6-tert-butylphenol and 2,6-di-tert-butyl-4-methylphenol; 2,6-di-tert-butylphenol; Pentaerythritoltetrakis(3-(3,5-di-tert-butyl-4-hydroxyphenyl)propionate) (previously known as Irganox™ 1010); Octyl-3,5-di-tert-butyl-4-hydroxy-hydrocinnamate; Octadecyl 3-(3,5-di-tert-butyl-4-hydroxyphenyl)propionate; 1,3,5-Trimethyl-2,4,6-tris(3,5-di-tert-butyl-4-hydroxybenzyl)benzene; 2,2',4,4'-Tetrakis-tert-butyl-3,3-dihydroxybiphenyl; 4,4-Butylidenebis(6-tert-butyl-m-cresol); 4,4'-Isopropyliden-bis-(2-tert-butylphenol); 2,2'-methylenebis(6-nonyl-p-cresol); 1,3,5-tris(3,5-di-tert-butyl-4-hydroxybenzyl-)-1,3,5-triazine-2,4,6(1H,3H,5H)trione; pyrogallol; N-nitroso-N-phenylhydroxylamine; 3-Propenylphenol, phenothiazine, N-Phenyl-2-naphthylamine, phosphorous acid phenyl-phosphonic acid; vinylphosphonic acid or combinations or mixtures thereof.

If present, the stabilizer(s) is present in the following amounts:
Lower amount: at least 0.001 or at least 0.005 or at least 0.01 wt. %;
Upper amount: at most 0.1 or at most 0.1 or at most 1 wt. %;
Range: 0.001 to 1 wt. % or 0.005 to 0.1 wt. %, or 0.01 to 0.1 wt. % with respect to the weight of the curable composition.

In certain embodiments, the radiation-curable composition described in the present text typically fulfils the following properties alone or in combination:
a) viscosity: 200 Pa*s or below at 23° C.;
b) pH value: 6 to 8, e.g. if the curable composition is brought in contact with wet pH sensitive paper;
c) radiation-curable with light having a wavelength in the range of 350 to 420 nm;
d) color: red, orange or yellow.

In certain embodiments, the combination of the following features is sometimes desirable: a), c) and d).

A lower viscous radiation-curable composition is sometimes easier to process in an additive-manufacturing process.

The radiation-curable composition described in the present text typically has a viscosity in the range of 1 to 200 Pa*s (23° C.) or 2 to 150 Pa*s (23° C.) or 3 to 100 Pa*s (23° C.), determined at a shear rate of 50 s$^{-1}$.

According to one embodiment, the radiation-curable composition comprises or essentially consists of:
Component A (mercapto functional polyorganosiloxane): 0.5 to 20 or 1 to 10 wt. %;
Component B (polyorganosiloxane(s) with at least two aliphatic unsaturated carbon-carbon moieties): 10 to 98 or 20 to 95 wt. %;
Component C (photo-initiator): 0.01 to 5 or 0.05 to 3 wt. %;
Component D (dye): 0.001 to 1 or 0.003 to 3 wt. %;
Component E (mercapto functional polyorganosiloxane with at least 50 mol % mercapto moieties): 0.1 to 15 or 0.3 to 12 wt. %;
Component F (solvent): 0 to 15 wt. %;
Component G (filler): 0 to 60 or 1 to 50 wt. %;
Component H (surfactant): 0 to 15 wt. %;
Component I (stabilizer): 0 to 1 wt. % or 0.001 to 1 wt. %;
wt. % with respect to the whole composition.

According to another embodiment, the radiation-curable composition comprises or essentially consists of:
Component A (mercapto functional polyorganosiloxane): 0.5 to 20 or 1 to 10 wt. %;
Component B (polyorganosiloxane(s) with at least two aliphatic unsaturated carbon-carbon moieties): 10 to 98 or 20 to 95 wt. %;
Component C (photo-initiator): 0.01 to 5 or 0.05 to 3 wt. %;
Component D (dye): 0.001 to 1 or 0.003 to 3 wt. %;
Component E (mercapto functional polyorganosiloxane with at least 50 mol % mercapto moieties): 0.1 to 15 or 0.3 to 12 wt. %;
Component F (solvent): 0 to 12 wt. %;
Component G (filler): 0 to 60 or 1 to 50 wt. %;
Component H (surfactant): 0 to 12 wt. %;
Component I (stabilizer): 0 to 1 wt. % or 0.001 to 1 wt. %;
wt. % with respect to the whole composition.

Additional embodiments are described below:

Embodiment 1

A radiation-curable silicone composition for additive-manufacturing technology as described in the present text comprising or essentially consisting of
mercapto-functional polyorganosiloxane(s) as Component A
being present in an amount of 0.5 to 20 wt. %,
having a fraction of (mercaptoalkyl)methylsiloxane units from 7 to 100 Mol-%, polyorganosiloxane(s) with at least two aliphatic unsaturated carbon-carbon moieties as Component B,
being present in an amount of 10 to 98 wt. %,
having a viscosity of 1 to 90,000 mPa*s,
photo-initiator(s) as Component C,
being present in an amount of 0.01 to 5 wt. %,
having a light absorption band in the range of 300 to 450 nm,
dye(s) as Component D dissolved in mercapto-functional polyorganosiloxane(s) as Component E, the mercapto-functional polyorganosiloxane(s) having a fraction of (mercaptoalkyl)methylsiloxane units of at least 50 mol %,
the dye(s) as Component D,
being present in an amount of 0.001 to 1 wt. %,
having a light absorption band in the range of 460 to 600 nm,
having a solubility of less than 1 g in 100 g water at 23° C.,
wt. % with respect to the weight of the whole composition.

Embodiment 2

A radiation-curable silicone composition for additive-manufacturing technology as described in the present text comprising or essentially consisting of
mercapto-functional polyorganosiloxane(s) as Component A being selected from components having the following formula

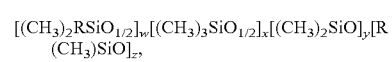

with w being 0 to 0.1, x being 0 to 0.1 and w+x being 0.01 to 0.1; y being 0 to 0.93, z being 0.07 to 0.99, wherein each R is independently selected from a mercapto $C_{1-10}$ hydrocarbyl group.

and mixtures thereof,
polyorganosiloxane(s) with at least two aliphatic unsaturated carbon-carbon moieties as Component B,
being selected from
components having the following formula

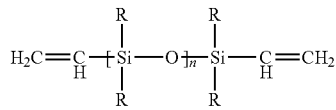

in which the radicals R, independently from each other, represent a non-substituted or substituted, monovalent hydrocarbon group with 1 to about 6 C atoms, and where n is chosen such that the viscosity of the polyorganosiloxane is in a range of 1 and 90,000 mPa*s,
QM-Resins,
and mixtures thereof,
photo-initiator(s) as Component C,
being selected from components having the following formula $(R^9)_2—P(=O)—C(=O)—R^{10}$ wherein each $R^9$ individually can be a hydrocarbyl group, any of which can be substituted with a halo-, alkyl- or alkoxy-group, or the two $R^9$ groups can be joined to form a ring along with the phosphorous atom, and wherein $R^{10}$ is a hydrocarbyl group, an S-, O-, or N-containing five- or six-membered heterocyclic group, or a —Z—C(=O)—P(=O)—$(R^9)_2$ group, wherein Z represents a divalent hydrocarbyl group such as alkylene or phenylene having from 2 to 6 carbon atoms,
and mixtures thereof,
dye(s) as Component D dissolved in mercapto-functional polyorganosiloxane(s) as Component E, the mercapto-functional polyorganosiloxane(s) having a fraction of (mercaptoalkyl)methylsiloxane units of at least 50 mol %,
the dye(s) as Component D,
being present in an amount of 0.001 to 1 wt. %,
having a light absorption band in the range of 460 to 600 nm,
having a solubility of less than 1 g in 100 g water at 23° C.,
wt. % with respect to the weight of the whole composition.

The radiation curable composition described in the present text does typically not comprise the following component(s) alone or in combination:
Pt-catalyst, in an amount of more than 0.00001 wt. % calculated with respect to the weight of Pt;
components comprising (meth)acrylate moieties in an amount of more than 5 wt. % or more than 2 wt. % or more than 1 wt. %;
components comprising epoxy moieties in an amount of more than 5 wt. % or more than 2 wt. % or more than 1 wt. %;
inorganic pigment(s) in an amount of more than 1 wt. %;
wt. % with respect to the whole composition.

Thus, the radiation-curable composition is essentially free of any of these components.

According to one embodiment, the radiation-curable composition described in the present text does not comprise a silicone moiety containing surfactant according to formula (6) where R and $R^3$ are —$CH_3$, $R^1$ is —$C_3H_6$—, $R^2$ is hydrogen, n is zero or 1, m is 1 or 2, a is 7, and b is 0, preferably in an amount of 0.5 to 1.5 wt. % with respect to the weight of the whole composition.

The radiation-curable composition described in the present text can be produced by mixing the respective components, particularly under save light conditions. If desired, a speed mixer can be used.

The dye(s) is dissolved in mercapto-functional polyorganosiloxane(s) having a fraction of (mercaptoalkyl)methylsiloxane units of at least 50 mol % first. This allows an effective dissolution of the dye(s) in the resin matrix of the radiation-curable composition.

This solution or composition is then combined with the other components of the radiation-curable composition.

Thus, a suitable process typically comprises or essentially consists of the following steps:
providing a solution of dye(s) according to Component D as described in the present text in a composition comprising mercapto-functional polyorgano-siloxane(s) having a fraction of (mercaptoalkyl)methylsiloxane units of at least 50 mol % according to Component E,
combining the solution containing the dye(s) dissolved in the mercapto-functional polyorganosiloxane(s) with
mercapto-functional polyorganosiloxane(s) according to Component A, organosiloxane(s) with at least two aliphatic unsaturated carbon-carbon moieties according to Component B,
photo-initiator(s) for initiating a curing reaction between Component A and Component B,
optionally filler(s), stabilizer(s) and additive(s).

During storage, the composition described in the present text is typically packaged in a suitable packaging device.

The curable composition described in the present text is typically stored in container. Suitable containers include vessels, foil bags, cartridges, etc.

The volume of the respective containers is not particularly limited, but is typically in a range of 2 to 200,000 ml or 5 to 100,000 ml or 10 to 50,000 ml.

The radiation-curable composition described in the present text is particularly useful for producing a transparent, elastomeric 3-dim article by processing the radiation-curable composition in an additive manufacturing process layer-by-layer comprising one or more radiation curing steps, in particular using an SLA process.

As a result, a transparent, elastomeric 3-dim article is obtained.

Such a process typically comprises the following steps:
providing a layer of the radiation-curable composition on a surface,
radiation curing those parts of the layer of the radiation-curable composition which will belong to the 3-dim article to be produced,
providing an additional layer of the radiation-curable composition in contact with the radiation cured surface of the previous layer,
repeating the previous steps until a 3-dim article is obtained.

Such a process comprises the step of applying radiation to the surface of a radiation-curable material, wherein the radiation is applied only to those parts of the surface which will later form a part of the article to be produced.

Radiation can be applied by using e.g. a laser beam or by mask-image projection. Using a mask-image projection based stereolithography process (MIP-SL) is sometimes preferred, as it allows a more rapid manufacturing of the article.

An MIP-SL process can be described as follows:
i. A three-dimensional digital model of the article to be produced is provided.
ii. The three-dimensional digital model is sliced by a set of horizontal planes.
iii. Each thin slice is converted into a two-dimensional mask image.
iv. The mask image is then projected with the aid of a radiation source onto the surface of the radiation-curable material being located in a building platform (e.g. having the shape of a vat).
v. The radiation-curable material is only cured in those regions which are exposed.
vi. The building platform containing the radiation-curable material or the layer of cured material is moved relative to the radiation source, wherein a new layer of radiation-curable material is provided being in contact with the layer of the cured material produced in the previous step.
vii. Steps (iv) to (vi) are repeated until the desired article is formed.

Projecting the mask image on the radiation-curable material can be done either top-down or bottom-up with respect to the orientation of the vat.

Using the bottom-up technique can be beneficial as less radiation-curable material is needed.

It was found that the radiation-curable composition described in the present text is in particular useful for processing it in a mask-image projection stereolithography process using the bottom-up projection technique.

The radiation-curable composition described in the present text can be used for producing a 3-dim article.

The 3-dim article obtained by curing the radiation-curable composition can typically be characterized by the following features alone or in combination:
a) tensile strength: 0.5 to 50 MPa or 1.0 to 30 MPa according to ISO/DIN 53504 (2015 August);
b) elongation at break: 10 to 1,000% or 50 to 500% according to ISO/DIN 53504 (2015 August);
c) Shore hardness A: 20 to 90 according to ISO/DIN 53505 (2000 August);
d) color: red, orange, or yellow to the human eye.

Thus, the 3-dim article is rubber-elastic.

A combination of the features b) and d) or a), b) and can sometimes be preferred.

The radiation-curable composition described in the present text is designed for producing elastomeric 3-dim articles by an additive manufacturing technique, particularly by stereolithography.

3-dim articles which can be produced can be of any shape including small articles having dimensions of less than 5 or 3 or 1 cm in x, y or z direction.

Examples include protection masks, inhaler masks, night guards, mouth guards, respirators, hearing protection, fittings, shock absorbers, sealing rings, orthodontic or dental appliances, or parts thereof.

The invention also relates to a kit of parts comprising the radiation-curable composition described in the present text and either of the following components alone or in combination:

3d-printing equipment, especially an SLA printer;
instruction of use.

The instruction of use typically describes under what conditions the radiation-curable composition should be used.

The complete disclosures of the patents, patent documents, and publications cited herein are incorporated by reference in their entirety as if each were individually incorporated. Various modifications and alterations to this invention will become apparent to those skilled in the art without departing from the scope and spirit of this invention. The above specification, examples and data provide a description of the manufacture and use of the compositions and methods of the invention. The invention is not limited to the embodiments disclosed herein. One skilled in the art will appreciate that many alternative embodiments of the invention can be made without departing from the spirit and scope of thereof.

The following examples are given to illustrate the invention.

Examples

Unless otherwise indicated, all parts and percentages are on a weight basis, all water is de-ionized water, and all molecular weights are weight average molecular weight. Moreover, unless otherwise indicated all experiments were conducted at ambient conditions (23° C.; 1013 mbar).

Methods

Viscosity

If desired, the viscosity can be measured at 23° C. using a ThermoHaake Rotovisco 1 device with a plate/plate system (diameter 20 mm) and a slit of 0.1 mm. The viscosity values (Pa*s) and share stress values (Pa) can be recorded for each share rate (starting from 10 1/s to 100 1/s in 10 1/s steps. For each share rate, a delay of 5 seconds was used before collecting data. The above-mentioned method of measurement corresponds essentially to DIN 53018-1.

Solubility

If desired, the solubility of the dye can be determined according to DIN EN ISO 7579 with the proviso that instead of shaking the mixture for 3 hours, the mixture is treated with ultrasound in an ultrasonic bath (50° C.) for 30 min. As solvent polyethylene glycol (Mn 400 g/mol) (PEG 400) or mercapto-functional polyorganosiloxane having a viscosity of 75-100 cSt is used.

Tensile Strength and Elongation at Break

If desired, the tensile strength and elongation of the compositions can be determined according to DIN 53504: 2017-03. The tensile strength is given in MPa and the elongation in % of the original length. Tensile strength and elongation data are evaluated by tearing three I-shaped specimens with a central unit of 20 mm*4 mm*2 mm in a Zwick Z020 Universal testing machine. The pastes are filled into a brass mould and each section is light-cured on both sides at 23° C. for overall 3 min using a curing light with 395 nm LED and a power of 630 mW/cm². The specimens are removed directly after the end of light-curing, three measurements are made and the mean value is determined (speed 200 mm/min).

Shore A Hardness

If desired, the Shore A hardness of the compositions can be determined according to DIN 53505:2000-08 and measured 10 minutes after start of light curing. All samples are light-cured for 20 seconds from both sides using a curing light containing 395 nm LED with a power of 630 mW/cm².

Printability in a Stereolithography Process

To determine the usability of a formulation in a stereolithographic additive manufacturing process, a test specimen can be prepared according the following procedure:

Additive Manufacturing Process

Compositions are processes in a DLP/SLA 3D-printer (Rapid Shape S30) at room temperature (23° C.) and 50% humidity to produce test specimen to check the detail accuracy of the resulting printed elastomers.

The following parameters are applied: light polymerization using an LED-lamp: 405 nm or 385 nm, 5 W/cm$^2$, separation gap: 2.5 mm, light exposure time: variable from 20 to 0.5 s, layer thickness 50 μm.

The specimens are cleaned in an ultrasonic bath filled with iso-propanol for 5 min and post-processed using an Otoflash™ light polymerization chamber at 2000 flashes in Argon Atmosphere.

To determine a suitable light exposure time for the test compositions, the light exposure times are varied though the printing process of the test specimen.

If the detail accuracy of the test specimen—determined by the number of sharp printed edges visible—was sufficient, a proper light exposure time can be selected for further printing of 3d articles.

The design of the test specimen showed several edges and notches of different width and height.

If desired, the printability of a composition in an SLA process can be rated by the number of clearly visible edges of the printed test specimen according to Table 1. The test specimen had the dimensions 25 mm*6 mm*20 mm and consisted of edges and notches of constantly reducing size and distance to each other from 2.0*2.0 mm to 1.0*0.04 mm.

TABLE 1

| Clearly visible edges | Rating |
| --- | --- |
| <5 | -- |
| 5-7 | - |
| 8-10 | + |
| >10 | ++ |

Materials

TABLE 2

| | |
| --- | --- |
| Poly(mercaptopropyl)methylsiloxane 75-100 cSt (75-100 mPa*s); 99-100 mol % (mercaptoalkyl)methylsiloxane units | Curable organic matrix/ Solvent |
| VQM-Resin 1, 0.18 mmol/g Vinyl, 10,000 mPa*s | Curable organic matrix |
| VQM-Resin 2, 0.72 mmol/g Vinyl, 800 mPa*s | Curable organic matrix |
| Pyrogenic silica dispersed in vinyl-terminated polydimethylsiloxane, viscosity 100 Pa*s; 0.07 mmol/g | Curable organic matrix/ filler |
| Hydrophobic fumed silica (BET 80-120 m$^2$/g) | Filler |
| Omnirad ™ 2022 | Photo-initiator |
| Lumogen ™ F Red 305 N,N'-Bis (2,6-Di(isoporopyl)phenyl)-1,6,7,12-tetraphenoxyperylene-3,4:9,10-bisimide | dye |
| Ethoxylated surfactant (Silwet ™ L-77) | Surfactant |

Preparation 2 wt. % solutions of the dye in either poly(mercaptopropyl)methylsiloxane having 99-100 mol % (mercaptoalkyl)methylsiloxane units (IE 1) or in the surfactant (CE 1 and CE 2) were prepared by mixing the components in a glass vessel and treating the mixture in an ultrasonic bath for 30 min at 50° C.

All compositions described in Table 3 were prepared by homogenizing the respective components to a uniform paste using a planetary mixer with vacuum capabilities (Speedmixer DAC 600.1 VAZ-P).

TABLE 3

| Component [wt. %] | IE 1 | CE 1 | CE 2 |
| --- | --- | --- | --- |
| Poly(mercaptopropyl)methylsiloxane 75-100 cSt | 3.2 | 4.7 | 4.7 |
| VQM Resin 1 | 81.0 | 79.5 | 82.5 |
| VQM Resin 2 | 9.0 | 9.0 | 9.0 |
| Aerosil R202 | 5.0 | 5.0 | 2.0 |
| Omnirad 2022 | 0.3 | 0.3 | 0.3 |
| 2 wt. % solution of red dye in ethoxylated surfactant | — | 1.5 | 1.5 |
| 2 wt. % solution of red dye in poly(mercaptopropyl)methylsiloxane 75-100 cSt | 1.5 | — | — |

IE = Inventive Example;
CE = Comparative Example

The compositions were tested with respect to mechanical/physical properties. The results are given in Table 4.

TABLE 4

| | IE 1 | CE 1 | CE 2 |
| --- | --- | --- | --- |
| Tensile strength [MPa] | 2.9 | 1.7 | 1.41 |
| Elongation at break [%] | 321 | 307 | 312 |
| Viscosity at 50 s$^{-1}$ [Pa*s] | 19 | 31 | 22 |
| Shore A hardness | 37 | 34 | 31 |

Evaluation

If the dye is dissolved in a surfactant, a curable composition can be provided which allows the processing of the composition in an additive-manufacturing process with sufficient surface resolution and acceptable mechanical properties (CE 2).

If better mechanical properties are desired (e.g., tensile strength and/or hardness), further filler needs to be added. This, however, goes along with an increase in viscosity, which typically results in a lower printing or processing speed in an additive-manufacturing process (CE 1).

If the dye is dissolved in poly(mercaptopropyl)methylsiloxane having a fraction of (mercaptoalkyl)methylsiloxane units of at least 50 mol % as solvent upfront, higher tensile strength values can be obtained at a lower viscosity. This allows the production of 3d-printed articles with better mechanical properties at faster printing speed (IE 1).

The invention claimed is:

1. A radiation-curable silicone composition for additive-manufacturing technology comprising
   mercapto-functional polyorganosiloxane(s) as Component A,
   organosiloxane(s) with at least two aliphatic unsaturated carbon-carbon moieties as Component B,
   photo-initiator(s) as Component C for initiating a curing reaction between Component A and Component B,
   dye(s) as Component D dissolved in mercapto-functional polyorganosiloxane(s) as Component E, the mercapto-functional polyorganosiloxane(s) having a fraction of (mercaptoalkyl)methylsiloxane units of at least 50 mol %,
   wherein Component D is dissolved in Component E before Component D is combined with the other components of the radiation-curable silicone composition.

2. The radiation-curable silicone composition according to claim 1, wherein the dye is characterized by the following features alone or in combination:
   solubility: at least 0.5 wt. % at 50° C. in polyethylene glycol with an Mn of 400 g/mol;
   having a light absorption maximum in the range of 460 to 600 nm;
   comprising a perylene moiety;
   color: red, orange or yellow;
   amount: being present in an amount of 0.001 to 1 wt. % with respect to the weight of the whole radiation-curable composition.

3. The radiation-curable silicone composition according to claim 1, wherein the mercapto-functional polyorganosiloxane according to Component A is characterized by the following features alone or in combination:
   fraction of (mercaptoalkyl)methylsiloxane units: 7-100 mol-%;
   being characterized by the following formula:

[(CH$_3$)$_2$RSiO$_{1/2}$]$_w$[(CH$_3$)$_3$SiO$_{1/2}$]$_x$[(CH$_3$)$_2$SiO]$_y$[R(CH$_3$)SiO]$_z$, with w being 0 to 0.1, x being 0 to 0.1 and w+x being 0.01 to 0.1; y being 0 to 0.93, z being 0.07 to 0.99, wherein each R is independently selected from a mercapto C$_{1-10}$ hydrocarbyl group;
   molecular weight (Mn): 500 to 20,000 g/mol;
   viscosity: 10 to 1,000 mPa*s at 23° C.;
   amount: being present in the composition of 0.5 to 50 wt. % with respect to the weight of the whole radiation-curable composition.

4. The radiation-curable silicone composition according to claim 1, the organosiloxane(s) with at least two aliphatic unsaturated carbon-carbon moieties being characterized by the following features alone or in combination:
   structure:

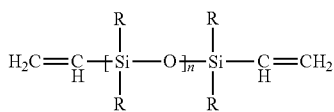

wherein R independently represent a non-substituted or substituted, monovalent hydrocarbon group with 1 to about 6 C atoms and wherein n is in the range of 3 to 10,000
   viscosity: 1 to 90,000 mPa*s at 23° C.;
   amount: being present in an amount of 10 to 98 wt. % with respect to the weight of the whole radiation-curable composition.

5. The radiation-curable silicone composition according to claim 1, the organosiloxane(s) with at least two aliphatic unsaturated carbon-carbon moieties comprising a QM resin containing vinyl groups, which is further characterized by the following features alone or in combination:
   concentration of unsaturated moieties: at least 0.15 mmol/g;
   viscosity: 500 to 90,000 mPa*s at 23° C.;
   amount: being present in an amount of 10 to 98 wt. % with respect to the weight of the whole radiation-curable composition.

6. The radiation-curable silicone composition according to claim 1 comprising two kinds of organosiloxane(s) with at least two aliphatic unsaturated carbon-carbon moieties,
a first organosilane with at least two aliphatic unsaturated carbon-carbon moieties being characterized by the following features alone or in combination;
   structure:

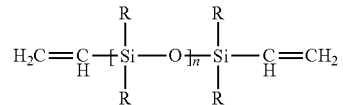

wherein R independently represent a non-substituted or substituted, monovalent hydrocarbon group with 1 to about 6 C atoms and wherein n is in the range of 3 to 10,000
   viscosity: 1 to 90,000 mPa*s at 23° C.;
   amount: being present in an amount of 10 to 98 wt. % with respect to the weight of the whole radiation-curable composition, and
a second organosilane with at least two aliphatic unsaturated carbon-carbon moieties comprising a QM resin containing vinyl groups, which is further characterized by the following features alone or in combination:
   concentration of unsaturated moieties: at least 0.15 mmol/g;
   viscosity: 500 to 90,000 mPa*s at 23° C.;
   amount: being present in an amount of 10 to 98 wt. % with respect to the weight of the whole radiation-curable composition.

7. The radiation-curable silicone composition according to claim 1 not containing a surfactant for dissolving the dye(s).

8. The radiation-curable silicone composition for use in an additive-manufacturing technology in particular according to claim 1 comprising
   mercapto-functional polyorganosiloxane(s) as Component A
      being present in an amount of 0.5 to 50 wt. %, and
      having a fraction of (mercaptoalkyl)methylsiloxane units of 7 to 100 mol-%;
   organosiloxane(s) with at least two aliphatic unsaturated carbon-carbon moieties as Component B,
      being present in an amount of 10 to 98 wt. %, and
      having a viscosity of 1 to 90,000 mPa*s,
   photo-initiator(s) as Component C,
      being present in an amount of 0.01 to 5 wt. %, and
      having a light absorption band in the range of 300 to 450 nm,
   dye(s) as Component D dissolved in mercapto-functional polyorganosiloxane(s) as Component E, the mercapto-functional polyorganosiloxane(s) having a fraction of (mercaptoalkyl)methylsiloxane units of at least 50 mol %,
      the dye(s) being present in an amount of 0.001 to 1 wt. %,
      having a light absorption maximum in the range of 460 to 600 nm, and
      having a solubility of less than 1 g in 100 g water at 23° C.,
      wt. % with respect to the weight of the whole composition.

9. A process of producing the radiation-curable composition as described in claim 1, the process comprising the steps of
   providing a solution of dye(s) according to Component D as described in claim 1 a composition comprising mercapto-functional polyorgano-siloxane(s) having a fraction of (mercaptoalkyl)methylsiloxane units of at least 50 mol % according to Component E, combining the solution containing the dye(s) dissolved in the mercapto-functional polyorganosiloxane(s) with mercapto-functional polyorganosiloxane(s) according to Component A, organosiloxane(s) with at least two aliphatic unsaturated carbon-carbon moieties according to Component B, photo-initiator(s) according to Component C for initiating a curing reaction between Component A and Component B, optionally filler(s), stabilizer(s) and additive(s).

10. A process of producing a cured 3-dimensional article, the process comprising the step of processing the curable composition as described in claim 1 by applying an additive-manufacturing technique comprising a radiation curing step.

11. The process according to the claim 10, wherein the radiation curing step is carried out within a wave length range of 350 to 420 nm.

12. A cured 3-dimensional article obtained or obtainable by radiation curing the radiation-curable composition of claim 1.

13. The cured 3-dimensional article as described in claim 12 being characterized by the following features alone or in combination:

being rubber-elastic;

having a Shore hardness A of 30 to 90 according to DIN/EN 53505 (2000 August);

having a tensile strength of 0.5 to 50 MPa according to DIN/EN 53504 (2017 March);

having an elongation at break of 10 to 1,000% according to DIN/EN 53504 (2017 March).

14. The cured 3-dim article as described in claim 12 having the shape of a protection mask, inhaler mask, night guard, mouth guard, respirator, hearing protection, fitting, orthodontic or dental appliances, or part thereof or for use as shock absorber or seal.

15. A kit of parts comprising the radiation-curable silicone composition as described in claim 1; and additive-manufacturing equipment.

* * * * *